(12) United States Patent
Lee et al.

(10) Patent No.: US 9,853,092 B2
(45) Date of Patent: Dec. 26, 2017

(54) OLED DISPLAY DEVICE HAVING TOUCH SENSOR AND METHOD OF MANUFACTURING THE SAME

(71) Applicant: LG Display Co., Ltd., Seoul (KR)

(72) Inventors: Namseok Lee, Seoul (KR); Yunho Kook, Gyeonggi-do (KR); Junghwan Lee, Daegu (KR); Taeyeon Yoo, Gyeonggi-do (KR); Yonghee Han, Gyeonggi-do (KR); Sunggon Hong, Seoul (KR); Jinwook Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 308 days.

(21) Appl. No.: 14/023,662

(22) Filed: Sep. 11, 2013

(65) Prior Publication Data

US 2014/0152912 A1 Jun. 5, 2014

(30) Foreign Application Priority Data

Nov. 30, 2012 (KR) .................. 10-2012-0138207
Jul. 31, 2013 (KR) .................. 10-2013-0091068

(51) Int. Cl.
*H01L 27/32* (2006.01)
*G06F 3/041* (2006.01)
*G06F 3/044* (2006.01)

(52) U.S. Cl.
CPC ............ *H01L 27/323* (2013.01); *G06F 3/044* (2013.01); *G06F 3/0412* (2013.01)

(58) Field of Classification Search
CPC .................................................. G06F 3/0412

(Continued)

(56) References Cited

U.S. PATENT DOCUMENTS 5,565,658 A * 10/1996 Gerpheide .............. G06F 3/041
178/18.02
6,825,833 B2 * 11/2004 Mulligan ................ G06F 3/044
178/18.06

(Continued)

FOREIGN PATENT DOCUMENTS

CN 101566747 A 10/2009
CN 102299166 A 12/2011

(Continued)

OTHER PUBLICATIONS

Japanese Office Action dated Aug. 19, 2014 for corresponding Japanese Patent Application No. 2013-188359.

(Continued)

*Primary Examiner* — Benyam Ketema
(74) *Attorney, Agent, or Firm* — Morgan, Lewis & Bockius LLP

(57) ABSTRACT

An OLED display device having a touch sensor is provided. The touch sensor includes a base layer; a plurality of first touch electrodes arranged in a first direction on a first surface of the base layer; a plurality of second touch electrodes arranged in a second direction crossing the first direction on a second surface of the base layer; a plurality of first routing wires connected to the first touch electrodes on the first surface of the base layer, respectively; a plurality of second routing wires separated from the plurality of first routing wires and formed on the first surface of the base layer; and a plurality of third routing wires connected to the second routing wires respectively via holes, and formed on the second surface of the base layer. The base layer is one of a barrier layer, an anti-scratch layer, and a circular polarization layer.

13 Claims, 12 Drawing Sheets

(58) Field of Classification Search
USPC .......................................................... 345/173
See application file for complete search history.

(56) References Cited

U.S. PATENT DOCUMENTS

| | | | | |
|---|---|---|---|---|
| 7,202,855 | B2* | 4/2007 | Shigetaka | G06F 3/044 |
| | | | | 178/18.01 |
| 8,564,550 | B2* | 10/2013 | Hashimoto | G06F 3/0418 |
| | | | | 178/18.06 |
| 9,244,560 | B2* | 1/2016 | Ningrat | G06F 3/0412 |
| 2002/0186209 | A1 | 12/2002 | Cok | |
| 2003/0052867 | A1 | 3/2003 | Shigetaka et al. | |
| 2003/0174128 | A1* | 9/2003 | Matsufusa | G06F 3/0412 |
| | | | | 345/205 |
| 2005/0083307 | A1* | 4/2005 | Aufderheide | G06F 3/044 |
| | | | | 345/173 |
| 2008/0211395 | A1* | 9/2008 | Koshihara | G06F 3/044 |
| | | | | 313/504 |
| 2008/0309635 | A1* | 12/2008 | Matsuo | G06F 3/044 |
| | | | | 345/173 |
| 2009/0085891 | A1* | 4/2009 | Yang | G06F 3/044 |
| | | | | 345/174 |
| 2010/0045620 | A1* | 2/2010 | Long | G06F 3/044 |
| | | | | 345/173 |
| 2010/0265806 | A1* | 10/2010 | Matsushima | G01D 15/00 |
| | | | | 369/53.41 |
| 2011/0109622 | A1* | 5/2011 | Son | G02F 1/13338 |
| | | | | 345/419 |
| 2011/0193801 | A1* | 8/2011 | Jung | G06F 3/0412 |
| | | | | 345/173 |
| 2011/0291978 | A1* | 12/2011 | Ho | G06F 3/045 |
| | | | | 345/173 |
| 2012/0242615 | A1* | 9/2012 | Teraguchi | G06F 3/0412 |
| | | | | 345/174 |
| 2013/0050137 | A1* | 2/2013 | Yang | G06F 3/044 |
| | | | | 345/174 |
| 2013/0106726 | A1* | 5/2013 | Ho | G06F 3/044 |
| | | | | 345/173 |
| 2013/0153390 | A1* | 6/2013 | Lee | G06F 3/044 |
| | | | | 200/600 |
| 2014/0062916 | A1* | 3/2014 | Hong | G06F 3/041 |
| | | | | 345/173 |

FOREIGN PATENT DOCUMENTS

| | | |
|---|---|---|
| JP | 2003-099185 A* | 4/2003 |
| JP | 2012-198416 A | 10/2012 |
| WO | 2012/046702 A1 | 4/2012 |

OTHER PUBLICATIONS

Chinese Office Action issued in Chinese Patent Application No. 201310430093.7 dated Jan. 28, 2016.

* cited by examiner

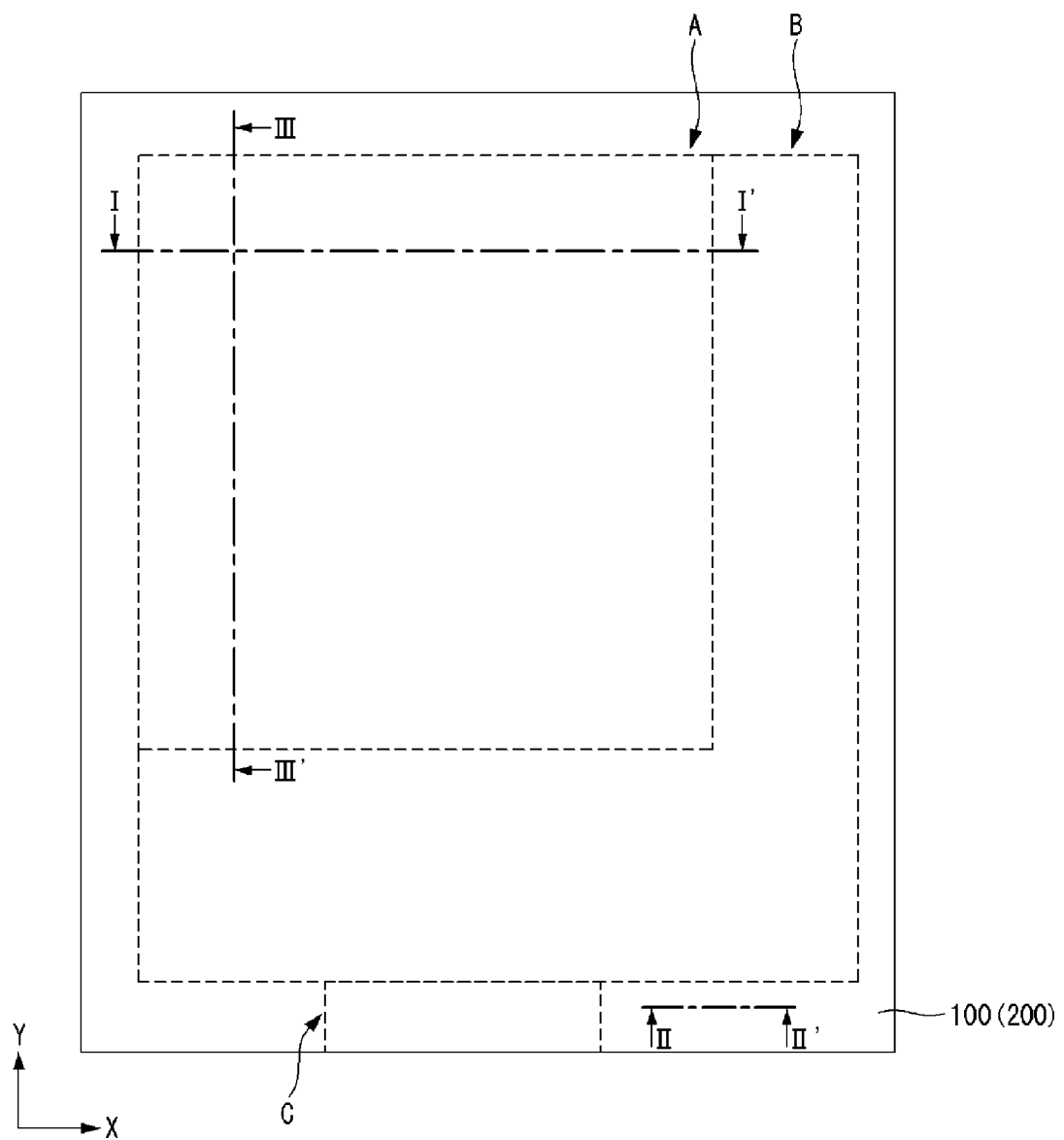

OLED DISPLAY DEVICE HAVING TOUCH SENSOR AND METHOD OF MANUFACTURING THE SAME

PRIORITY CLAIM

This application claims the benefit of priority under 35 U.S.C. §119(a) to Korean Patent Application No. 10-2012-0138207 filed on Nov. 30, 2012, and Korean Patent Application No. 10-2013-0091068 filed on Jul. 31, 2013, the contents of each of which are incorporated by reference herein in their entirety.

FIELD OF THE INVENTION

This disclosure relates to a display device having a touch sensor and a method of manufacturing the same, more specifically an organic light emitting diode (OLED) display device capable of reducing cost as well as thickness and weight thereof and a method of manufacturing the same.

DISCUSSION OF THE RELATED ART

In recent years, liquid crystal display (LCD) devices and organic light emitting diode (OLED) display devices have become a mainstream in a flat display device market. In particular, the OLED display device has been gradually gaining popularity because it is a self light emitting element without requiring a backlight which is used in the LCD device, thereby capable of implementing a light weight and thin display.

Also, in more recent years, a flexible OLED display device is significantly drawing attention as a next generation flat display device because a substrate of the flexible OLED display device is made of a flexible material such as plastic or metal foil which is bendable as paper while maintaining display performance.

The substrate of the flexible OLED display device has merits in that its weight is very light, its crashworthiness is excellent, its cost is very cheap, but has demerits in that moisture or oxygen is easily permeated thereto.

For this reason, the related art flexible OLED display device has protection films including at least three layers.

Hereinafter, a related art OLED display device is described in detail with reference to FIGS. 1A and 1B. FIG. 1A is a cross-sectional view schematically illustrating a related art OLED display device, and FIG. 1B is a cross-sectional view schematically illustrating a related art OLED display device having a touch sensor which is applied to the OLED display device shown in FIG. 1A.

Referring to FIG. 1A, the flexible OLED display device includes a thin film transistor (TFT) substrate 10 on which display elements including data lines, gate lines, and thin film transistors are formed, organic light emitting diodes (OLEDs) 11 formed on the TFT substrate 10, and protection films 13 encapsulating the substrate 10 and the OLEDs 11.

The protection films 13 are configured to prevent moisture and oxygen from permeating into the OLED 11. The protection films 13 include two inorganic protection films 13a and 13c, and one organic protection film 13b disposed between the two inorganic protection films 13a and 13c. In order to prevent the moisture or oxygen from permeating into the OLED, it is more suitable for the inorganic protection films 13a and 13c than the organic protection film 13b. The organic protection film 13b complements crashworthiness of the inorganic protection films 13a and 13c.

The inorganic protection films 13a and 13c are selected from group including silicon oxide ($SiO_2$), silicon nitride (SixNy), silicon oxynitride ($SiO_2$) aluminum oxide (AlOx), aluminum nitride (AlNx), titanium oxide ($TiO_2$) and zinc oxide (ZnOx). The organic protection film 13b is made of monomer or polymer material. The monomer is selected from group including acrylate monomer, phenylacetylene, diamine, dianhydride, siloxane, silane, and parylenea. The polymer material is selected from group including olefin-based polymers such as polyethylene and polypropylene, polyethylene terephthalate (PET), fluororesin, and polysiloxane.

The flexible OLED display device having the above-mentioned protection film with the three-layer-laminated construction prevents moisture and oxygen from permeating into the OLED 11.

In FIG. 1A, the flexible OLED display device further includes an anti-reflection film 14, a window cover 15, and a sealant 18. The anti-reflection film 14 has a construction in which a linear polarization film and a circular polarization film are laminated. The sealant 18 is formed between the TFT substrate 10 and the window cover 15 to seal the inside of the flexible OLED display device. In FIG. 1A, a display panel is referenced as DP.

Referring to FIG. 1B, the flexible OLED display device includes a touch sensor TS interposed between the window cover W and a OLED display panel DP.

The touch sensor TS can be classified into a resistive type, a capacitive type, and an electromagnetic type based on a method for sensing a touched portion. The resistive type touch sensor senses the touched portion by a voltage gradient depending on resistance in a state where a DC voltage is applied to a metal electrode formed on an upper substrate or a lower substrate. The capacitive type touch sensor senses the touched portion by forming an equipotential surface on a conductive layer and sensing a voltage change location of upper and lower substrates based on a touch operation. The electromagnetic type touch sensor senses the touched portion by reading an LC value induced by touching a conductive layer with an electronic pen. Also, optical type and ultrasonic type touch sensors are known besides them.

Among the above-mentioned sensors, the most popular type used in the present technical field is the capacitive type touch sensor. The capacitive type has a matrix construction in which first electrode patterns and second electrode patterns are crossing over each other. In the capacitive type touch sensor, if the user touches an arbitrary position on the matrix construction, the touched position is detected by finding X and Y coordinates on the matrix where a change of electrostatic capacitance occurs. Thus, an exact touch position can be detected even if the user touches the touch sensor lightly.

The touch sensor applied to the OLED display device as shown in FIG. 1B is a capacitive type touch sensor.

Referring to FIG. 1B, the touch sensor TS includes a transparent substrate 20, a plurality of touch driving electrodes Tx formed in parallel on one surface of the transparent substrate 20, and a plurality of touch sensing electrodes Rx formed in parallel on another surface of the transparent substrate 20 to cross the plurality of touch driving electrodes Tx. A window cover W is attached on an upper surface of the touch sensor TS (on which the touch sensing electrodes Rx are formed) by a first adhesive agent A1, and a OLED display device DP is attached on a lower surface of the touch sensor TS (on which the touch driving electrodes Tx are formed) by a second adhesive agent A2.

In case the touch sensor is applied to a flexible OLED display device, it is generally proposed to add the touch sensor to the flexible OLED display device. It is referred to as an add-on type touch sensor.

However, the add-on type touch sensor causes thickness, weight and manufacturing cost of a display device to increase because the add-on type touch sensor has a structure in which the add-on type touch sensor is mounted on the flexible OLED display device.

SUMMARY OF THE INVENTION

Embodiments of this disclosure provide a flexible OLED display device capable of reducing thickness, weight and manufacturing cost of a display device by sharing a touch sensing element for recognizing a touch operation with a component of the display device, and a method of manufacturing the same.

In one aspect, there is a flexible OLED display device having a touch sensor. The touch sensor includes a base layer; a plurality of first touch electrodes arranged in a first direction on a first surface of the base layer; a plurality of second touch electrodes arranged in a second direction crossing the first direction on a second surface of the base layer; a plurality of first routing wires connected to the plurality of first touch electrodes on the first surface of the base layer, respectively; a plurality of second routing wires separated from the plurality of first routing wires and formed on the first surface of the base layer; and a plurality of third routing wires connected to the plurality of second routing wires respectively via holes, and formed on the second surface of the base layer, wherein the base layer is one of a barrier layer, an anti-scratch layer, and a circular polarization layer.

The circular polarization layer disposed on the touch sensor, wherein the base layer is one of the barrier layer and the anti-scratch layer.

Also, the touch sensor further includes a linear polarization layer disposed on the touch sensor, wherein the base layer is the circular polarization layer.

Also, the touch sensor further includes an inorganic layer disposed between the base layer and the second touch electrodes and the third routing wires.

Also, each of the holes is a through hole passing through the second routing wire, the base layer, the inorganic layer, and the third routing wire.

Otherwise, each of the holes may be a contact hole passing through the base layer, the inorganic layer, and the third routing wires to expose the third routing wire, or a contact hole passing through the third routing wire, the inorganic layer, and the base layer to expose the second routing wire.

Also, the touch sensor further includes comprising a plurality of connectors filled within the holes to connect the second routing wires to the third routing wires, respectively.

Also, each of the first and second touch electrodes is formed of a transparent conductive layer, and each of the first, second and third routing wires is formed of a transparent conductive layer and metal layer.

In another aspect, there is a method of manufacturing a flexible OLED display device having a touch sensor. The process of forming the touch sensor includes: preparing a base layer having a touch electrode forming area and a routing wire forming area; sequentially forming a transparent conductive layer and a metal layer on a first and a second surfaces of the base layer, respectively; forming a plurality of first touch electrodes in the electrode forming area of the first surface of the base layer; forming a plurality of first routing wires connected to the plurality of first touch electrodes in the routing wire forming area of the first surface of the base layer, respectively; forming a plurality of second routing wires separated from the plurality of first routing wires touch electrodes in the routing wire forming area of the first surface of the base layer; forming a plurality of second touch electrodes in the electrode forming area of the second surface of the base layer; and forming a plurality of third routing wires in the routing wire forming area of the second surface of the base layer; forming at least one hole to pass through at least two excluding the second routing wire or the third routing wire of the second routing wire, the base layer, and the third routing wire; and filling metal material within the hole to form a connector connecting the second routing wire to the third routing wire.

In the method, the forming the first and the second touch electrodes, and the first, the second and the third routing wires includes: forming the plurality of first touch electrodes, the plurality of first routing wires, and the plurality of second routing wires by using a first mask, each of them including the transparent conductive layer and the metal layer, and the plurality of second touch electrodes and the plurality of third routing wires by using a second mask, each of them including the transparent conductive layer and the metal layer; and forming the plurality of first touch electrodes in which the metal layer is removed by using a third mask, and the plurality of second touch electrodes in which the metal layer is removed by using a fourth mask.

In the method, the plurality of first touch electrodes, the plurality of first routing wires, and the plurality of second routing wires are simultaneously formed, and the plurality of second touch electrodes and the plurality of third routing wires are simultaneously formed.

In the method, the plurality of first touch electrodes, the plurality of first routing wires, the plurality of second routing wires, the plurality of second touch electrodes and the plurality of third routing wires are simultaneously formed.

The method, after the base layer is prepared, further includes forming inorganic film on the second of the base layer, wherein the plurality of second touch electrodes and the plurality of third routing wires are formed on the inorganic film.

In the method, the hole is formed by any one of a laser drill method, a computerized numerical control (CNC) method, and a punching method.

In the method, the connector is formed by any one of a screen printing method, a dispense method, an inkjet method, and an electroplating method.

According to the OLED display panel having a touch sensor, it is possible to reduce thickness, weight and manufacturing cost thereof because the base layer of the touch sensor according to one embodiment of this disclosure may be served as at least one of a barrier film for preventing moisture or oxygen from permeating the organic light emitting diode OLED, an anti-scratch film, and a circular polarization film.

BRIEF DESCRIPTION OF THE DRAWINGS

The teachings of the embodiments can be readily understood by considering the following detailed description in conjunction with the accompanying drawings.

FIG. 5 is a top planer view illustrating a first process for manufacturing a touch sensor according to one embodiment of this disclosure;

DETAILED DESCRIPTION OF THE EMBODIMENTS

Figure 1A:
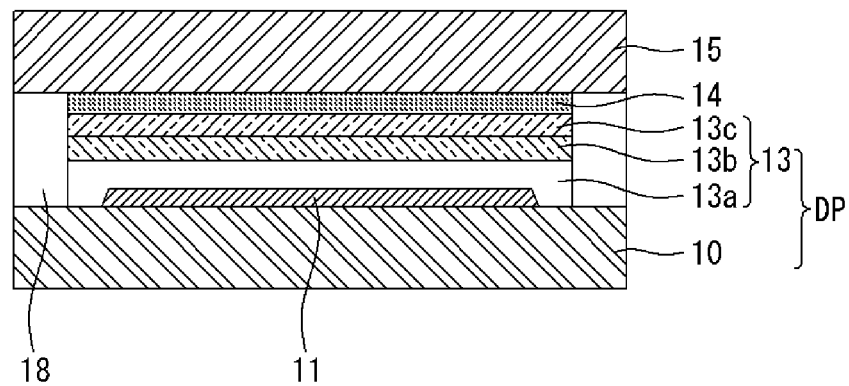
FIG. 1A is a cross-sectional view schematically illustrating a related art flexible OLED display device.
Figure 1B:
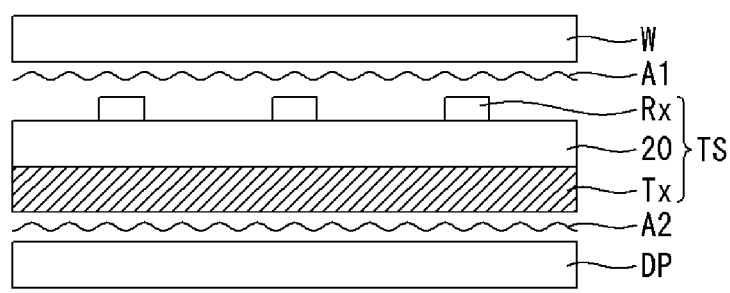
FIG. 1B is a cross-sectional view schematically illustrating a related art flexible OLED display device having a touch sensor.

Hereinafter, exemplary embodiments of this disclosure will be described in detail with reference to the accompanying drawings, wherein same reference numerals may be used to denote the same or substantially the same elements throughout the specification and the drawings.

An OLED display device according to one embodiment of this disclosure is described in detail with reference to FIGS. 2 to 4B.

Figure 2:
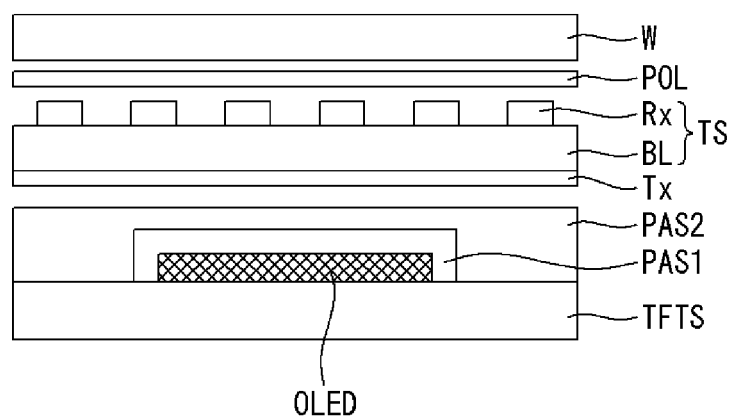
FIG. 2 is a cross-sectional view schematically illustrating a flexible OLED display device having a touch sensor according to one embodiment of this disclosure.
Figure 3:
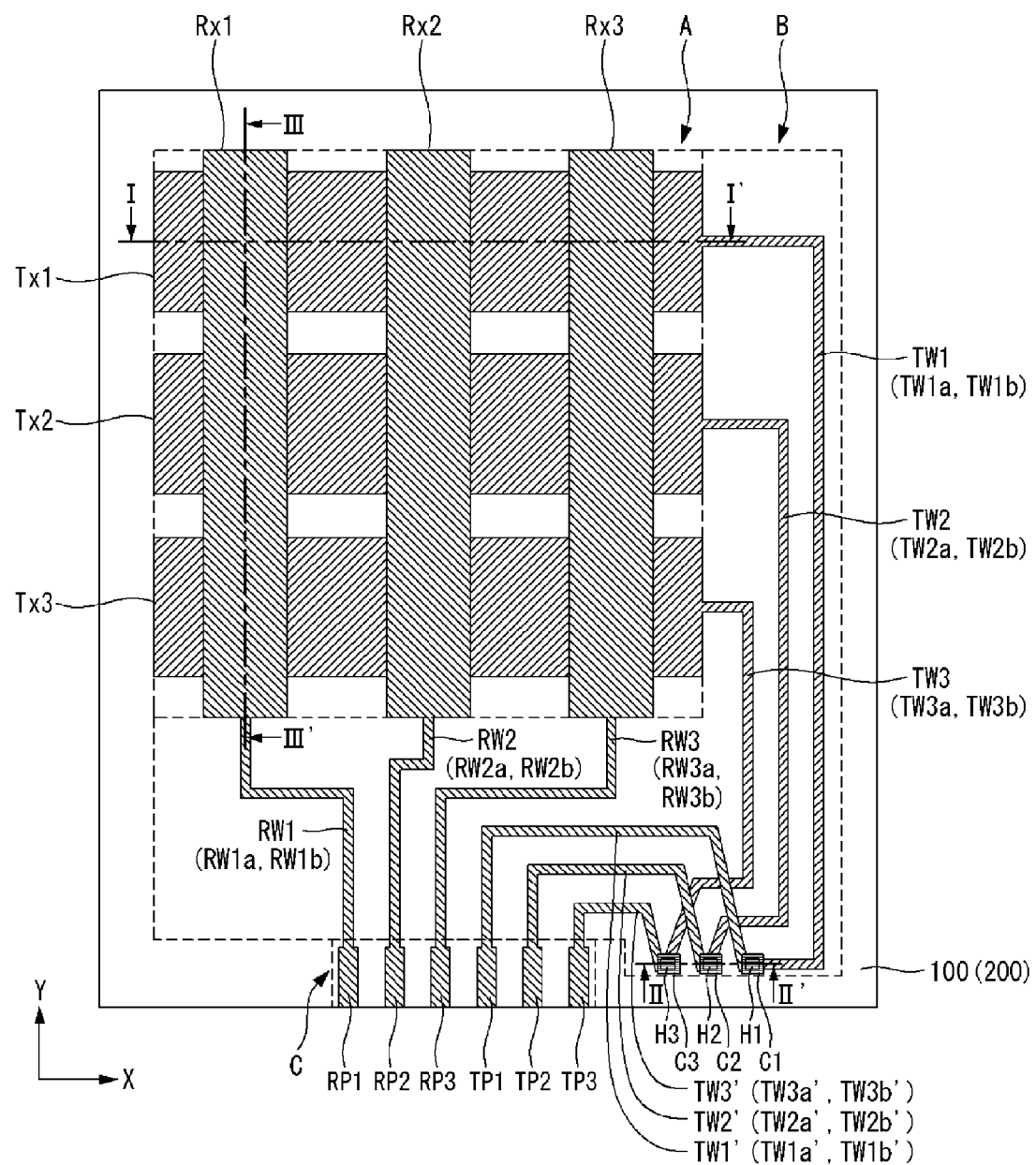
FIG. 3 is a top planer view illustrating a touch sensor according to one embodiment of this disclosure shown in FIG. 2.
Figure 4A:
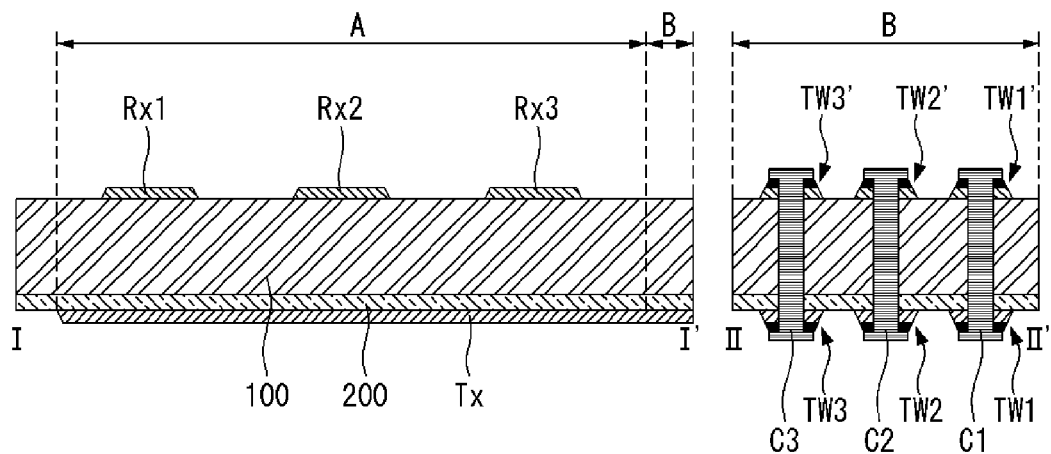
FIG. 4A is a cross-sectional view taken along lines I-I' and II-II' of FIG. 3.
Figure 4B:
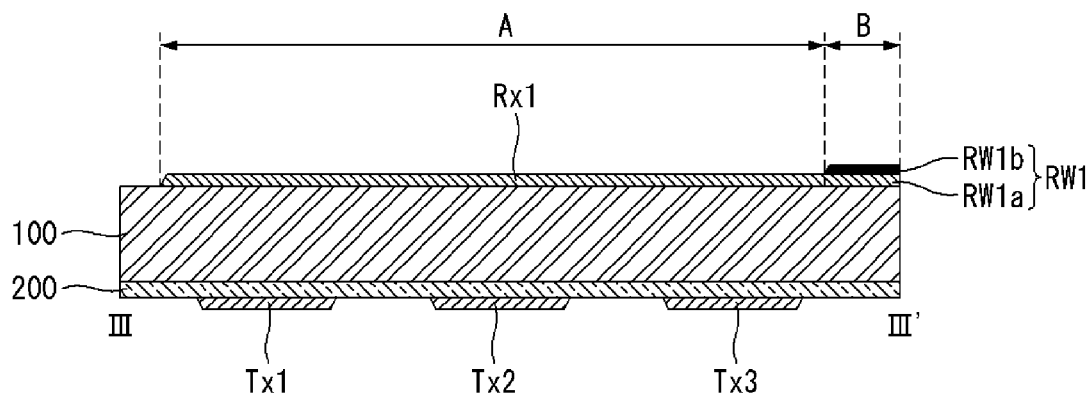
FIG. 4B is a cross-sectional view taken along line III-III' of FIG. 3.

FIG. 2 is a cross-sectional view schematically illustrating a flexible OLED display device having a touch sensor according to one embodiment of this disclosure, FIG. 3 is a top planer view illustrating a touch sensor according to one embodiment of this disclosure shown in FIG. 2, FIG. 4A is a cross-sectional view taken along lines I-I' and II-II' of FIG. 3, and FIG. 4B is a cross-sectional view taken along line III-III' of FIG. 3.

Referring to FIG. 2, the OLED display device according to one embodiment of this disclosure includes a thin film transistor (TFT) substrate TFTS in which display elements (not shown) including data lines, gate lines and thin film transistors are formed, organic light emitting diodes OLED formed on the TFT substrate TFTS, a first passivation layer PAS1 enveloping the organic light emitting diodes OLED to prevent moisture and oxygen from permeating into the organic light emitting diodes OLED, a second passivation layer PAS2 formed on the first passivation layer PAS1 to prevent moisture and oxygen from permeating into the organic light emitting diodes OLED, a touch sensor TS disposed on the second passivation layer PAS2, a polarization film POL disposed on the touch sensor TS to pass light from the organic light emitting diodes OLED in a predetermined direction, and a window cover W for protecting the touch sensor TS.

The touch sensor TS includes a base layer BL, a plurality of first touch electrodes Rx1 to Rx3 formed on one surface of the base layer BL, and a plurality of second touch electrodes Tx formed on another surface of the base layer BL.

Referring to FIGS. 3, 4A and 4B, the touch sensor TS includes a touch electrode forming area A in which touch electrodes are formed, a routing wire forming area B in which routing wires connected to the touch electrodes are formed, and a pad forming area C in which the routing wires are connected to signal wires of a touch driving circuit (not shown).

The electrode forming area A includes a plurality of first touch electrodes Rx1 to Rx3 formed on one surface of the base layer 100, an inorganic layer 200 which is formed on an another surface of the base layer 100, and a plurality of second touch electrodes Tx1 to Tx3 formed on an inorganic layer 200.

The first touch electrodes Rx1 to Rx3 are arranged on the first surface of the base layer 100 in parallel to each other in a first direction (for example, Y-axis direction) parallel to each other. The second touch electrodes Tx1 to Tx3 are arranged on the inorganic layer 200 in parallel to each other in a second direction (for example X-axis direction) which crosses the first direction. The first and second touch electrodes Rx1 to Rx3 and Tx1 to Tx3 are insulated from each other because they are arranged to cross over each other with the base layer 100 and the inorganic layer 200 therebetween.

In the touch sensor according to one embodiment of this disclosure, the base layer 100 may be formed from optical isotropy material having non-elongation property such as polycarbonate (PC), or cyclo olefin polymer (COP).

The base layer 100 of the touch sensor according to one embodiment of this disclosure may be served as at least one of a barrier film for preventing moisture or oxygen from permeating the organic light emitting diode OLED, an anti-scratch film, and a circular polarization film. Herein, if the base layer 100 of the touch sensor TS serves as the barrier film and/or the anti-scratch film, the polarization film POL is to a circular polarization film. On the other hand, if the base layer 100 of the touch sensor TS serves as the circular polarization film, the polarization film POL is to a linear polarization film.

Each of the first and second touch electrodes Rx1 to Rx3 and Tx1 to Tx3 may be formed of a transparent conductive material such as indium tin oxide (ITO), indium zinc oxide (IZO), gallium-doped zinc oxide (GZO), metal mesh type transparent electrode, and metal nanowire or carbon-based transparent electrode.

The inorganic film 200 formed on another surface of the base layer 100 may be formed from material such as silicon oxide ($SiO_2$), silicon nitride (SiNx), silicon oxynitride (SiOxNy), aluminium oxide (AlOx), aluminium nitride (AlNx), titanium oxide ($TiO_2$), or zinc oxide (ZiO).

The routing wire forming area B is defined outside of the electrode forming area A and includes a plurality of first routing wires RW1 to RW3, a plurality of second routing wires TW1'~TW3', a plurality of third routing wires TW1 to TW3, a plurality of holes H1 to H3, and a plurality of connectors C1 to C3 connecting the second routing wires TW1' to TW3' to the third routing wires TW1 to TW3 via the holes H1 to H3.

The plurality of first routing wires RW1 to RW3 are formed of double layers including first-layer routing wires RW1a to RW3a extended from the first touch electrodes Rx1 to Rx3 respectively, and second-layer routing wires RW1b to RW1b formed on the first-layer routing wires RW1a to RW3a respectively.

The plurality of second routing wires TW1' to TW3' are connected to the third routing wires TW1 to TW3 respectively by the plurality of connectors C1 to C3, and formed of double layers including first-layer routing wires TW1a' to TW3a', and second layers TW1b' to TW3b' formed on the first-layer routing wires TW1a' to TW3a' respectively.

The plurality of third routing wires TW1 to TW3 are connected to the third routing wires TW1 to TW3 respectively by the plurality of connectors C1 to C3, and formed of double layers including first-layer routing wires TW1a' to TW3a', and second layers TW1b' to TW3b' formed on the first-layer routing wires TW1a' to TW3a' respectively.

As mentioned above, each of the first to third routing wires RW1 to RW3, TW1 to TW3 and TW1' to TW3' has a double layer construction including first-layer routing wires RW1a to RW3a, TW1a' to TW3a', and TW1a to TW3a and second-layer routing wires RW1b to RW3b, TW1b' to TW3b', and TW1b to TW3b respectively. The first-layer routing wires RW1a to RW3a, TW1a' to TW3a', and TW1a to TW3a may be formed of a transparent conductive material such as indium tin oxide (ITO), indium zinc oxide (IZO), gallium-doped zinc oxide (GZO), metal mesh type transparent electrode, and metal nanowire or carbon-based transparent electrode. The second-layer routing wires RW1b to RW3b, TW1b' to TW3b', and TW1b to TW3b may be formed of metal material such as Al, AlNd, Mo, MoTi, Cu, Cr, Ag, and Ag-based alloy.

In the embodiment of this disclosure, each of the plurality of holes H1 to H3 is formed of through hole type. But this disclosure does not limited thereto. For example, the holes may be formed of contact holes which pass through the second routing wires TW1' to TW3', the base layer 100 and the inorganic layer 200 to expose the third routing wires TW1 to TW3, or pass through the third routing wires TW1 to TW3, the inorganic layer 200 and the base layer 100 to expose the second routing wires TW1' to TW3'.

The plurality of connectors C1 to C3 are filled with the holes H1 to H3 respectively to connect the second routing wires TW1' to TW3' to the third routing wires TW1 to TW3, respectively. The connectors C1 to C3 may be formed of metal material such as Al, AlNd, Mo, MoTi, Cu, Cr, Ag, and Ag-based alloy.

The pad forming area C is defined neighbored to the routing wire forming area B, and includes a plurality of first routing pads RP1 to RP3 and a plurality of second routing pads TP1 to TP3.

The plurality of first routing pads RP1 to RP3 are connected to the plurality of first touch electrodes Rx1 to Rx3 via the plurality of first routing wires RW1 to RW3, respectively. The plurality of second routing pads TP1 to TP3 are connected to the plurality of second touch electrodes Tx1 to Tx3 via the plurality of third routing wires TW1 to TW3 and the plurality of second routing wires TW1' to TW3'. Each of the first and second routing pads RP1 to RP3, TP1 to TP3 has a double layer construction including a first layer of transparent conductive material and a second layer of metal material as the routing wire.

Hereinafter, a method of manufacturing a touch sensor according to one embodiment of this disclosure will be described with reference to FIGS. 5A to 12B.

First of all, a process of forming an inorganic film 200 on a base layer 100 is described with reference to FIGS. 5, 6A and 6B. FIG. 5 is a top planer view illustrating a first process for manufacturing a touch sensor according to one embodiment of this disclosure, FIG. 6A is a cross-sectional view taken along lines I-I' and II-II' of FIG. 5, and FIG. 6B is a cross-sectional view taken along line III-III' of FIG. 5.

Figure 6A:
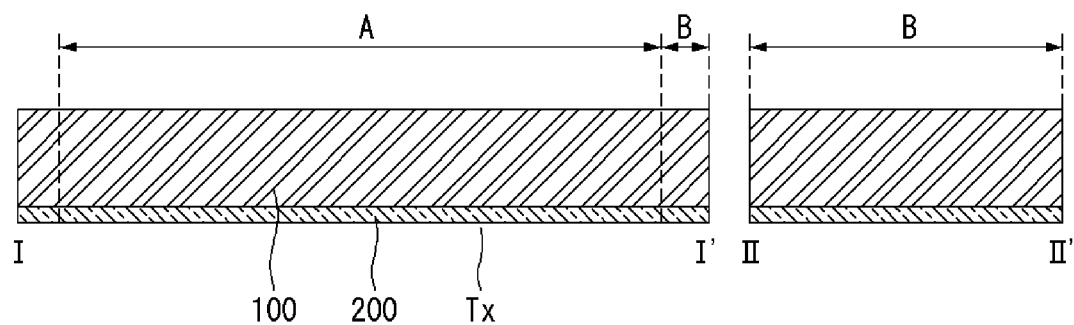
FIG. 6A is a cross-sectional view taken along lines I-I' and II-II' of FIG. 5.
Figure 6B:
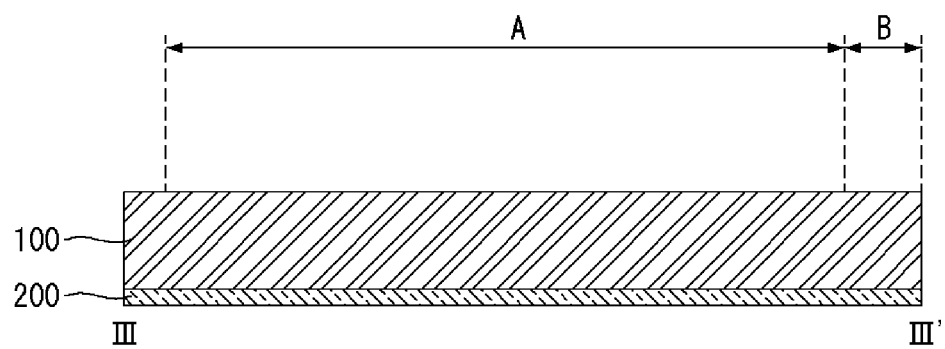
FIG. 6B is a cross-sectional view taken along line III-III' of FIG. 5.

Referring to FIGS. 5, 6A and 6B, an inorganic film 200 is formed on a base layer 100 through a deposition process such as a sputtering. The base layer 100 may be formed from optical isotropy material having non-elongation property such as polycarbonate (PC), or cyclo olefin polymer (COP). The inorganic film 200 may be formed from material such as silicon oxide ($SiO_2$), silicon nitride (SiNx), silicon oxynitride (SiOxNy), aluminium oxide (AlOx), aluminium nitride (AlNx), titanium oxide ($TiO_2$), or zinc oxide (ZiO).

Figure 7:
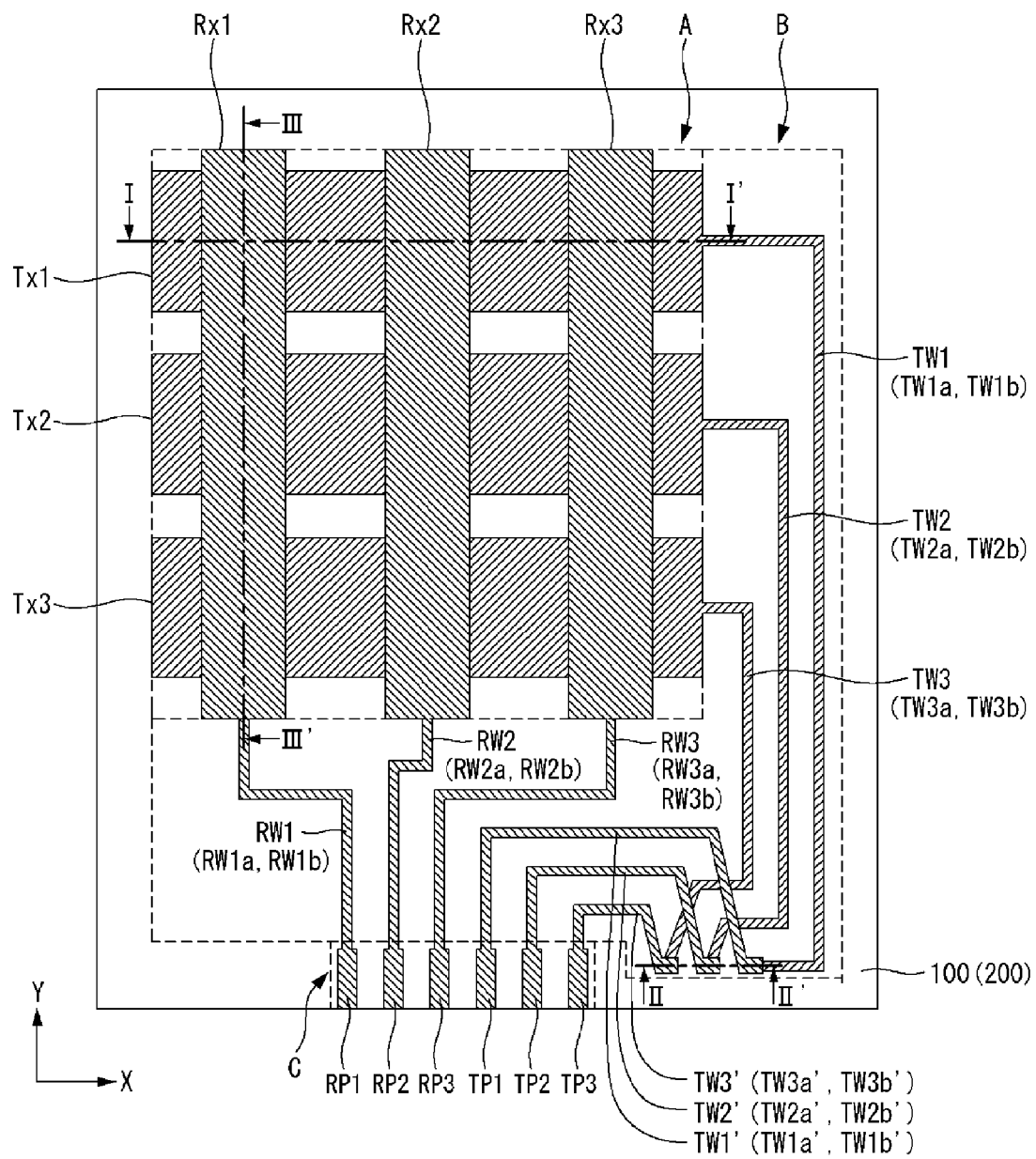
FIG. 7 is a top planer view illustrating a second process for manufacturing a touch sensor according to one embodiment of this disclosure.

Secondly, a process of forming first and second touch electrodes, first and second routing wires and first and second routing pads is described with reference to FIGS. 7, 8A and 8B. FIG. 7 is a top planer view illustrating a second process for manufacturing a touch sensor according to one embodiment of this disclosure, FIG. 8A is a cross-sectional view taken along lines I-I' and II-II' of FIG. 6, FIG. 8B is a cross-sectional view taken along line III-III' of FIG. 6.

Figure 8A:
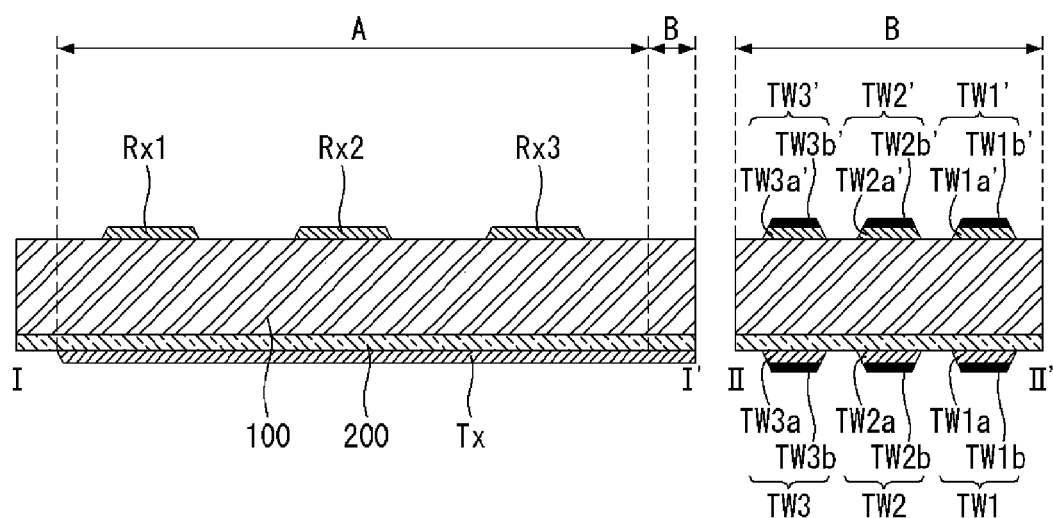
FIG. 8A is a cross-sectional view taken along lines I-I' and II-II' of FIG. 6.
Figure 8B:
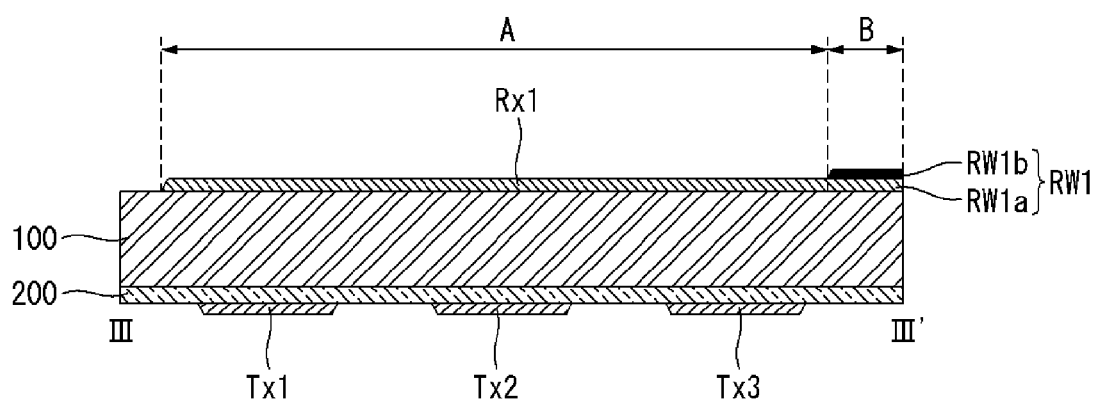
FIG. 8B is a cross-sectional view taken along line III-III' of FIG. 6.

Referring to FIGS. 7, 8A and 8B, a transparent conductive layer and a metal layer are sequentially formed on one surface of the base layer 100 and the inorganic layer 200 formed on another surface of the base layer 100. And then first and second touch electrodes Rx1 to Rx3 and Tx1 to Tx3, first to third routing wires RW1 to RW3, TW1' to TW3' and TW1 to TW3, and first and second routing pads RP1 to RP3 and TP1 and TP3 by patterning the transparent conductive layer and the metal layer.

More specifically, a transparent conductive layer and a metal layer are sequentially formed on one surface of the base layer 100 and the inorganic layer 200 formed on another surface of the base layer 100 respectively through deposition process such as a plasma-enhanced chemical vapor deposition (PECVD).

Photo resists are then entirely applied to the metal layer formed on the base layer 100 and the metal layer formed on the inorganic layer 200, respectively. A first photo resist pattern (not shown) is formed on the metal layer on the base layer 100 by a photolithography using a first mask. The first photo resist pattern exposes the metal layer excluding areas where the first touch electrodes Rx1 to Rx3, the first routing wires RW1 to RW3, the second routing wires TW1' to TW3', the first routing pads RP1 to RP3, and the second routing pads TP1 to TP3 are to be formed. A second photo resist pattern (not shown) is formed on the metal layer on the inorganic layer 200 by a photolithography using a second mask. The second photo resist pattern (not shown) exposes the metal layer excluding areas where the second touch electrodes Tx1 to Tx3, the third routing wires TW1 to TW3 are to be formed.

The metal layer and the transparent conductive layer on the base layer 100 exposed through the first photo resist pattern are removed by etching. And then, the first photo resist pattern is removed to form the first touch electrodes Rx1 to Rx3, the first routing wires RW1 to RW3, the second routing wires TW1' to TW3', the first routing pads RP1 to RP3, and the second routing pads TP1 to TP3. Each of the first touch electrodes Rx1 to Rx3, the first routing wires RW1 to RW3, the second routing wires TW1' to TW3', the first routing pads RP1 to RP3, and the second routing pads TP1 to TP3 has a double layer construction including the transparent conductive layer and the metal layer.

Meanwhile, the metal layer and the transparent conductive layer on the inorganic layer 200 exposed through the second photo resist pattern are removed by etching. And then, the second photo resist pattern is removed to form the second touch electrodes Tx1 to Tx3 and the third routing wires TW1 to TW3. Each of the second touch electrodes Tx1 to Tx3 and the third routing wires TW1 to TW3 has a double layer construction including the transparent conductive layer and the metal layer.

As a result, the plurality of first touch electrodes Rx1 to Rx3, the plurality of first routing wires RW1 to RW3, the plurality of second routing wires TW1' to TW3', the plurality of first routing pads RP1 to RP3, and the plurality of second routing pads TP1 to TP3 are formed on the base layer 100, and the plurality of second touch electrodes Tx1 to Tx3 and the third routing wires TW1 to TW3 are formed on the inorganic film 200.

Photo resists are entirely applied to the base layer 100 on which the plurality of first touch electrodes Rx1 to Rx3, the plurality of first routing wires RW1 to RW3, the plurality of second routing wires TW1' to TW3', the plurality of first routing pads RP1 to RP3, and the plurality of second routing pads TP1 to TP3 are formed, and the inorganic layer 200 on which the plurality of second touch electrodes Tx1 to Tx3 and the third routing wires TW1 to TW3 are formed.

A third photo resist pattern (not shown) is formed on the base layer 100 on which the first touch electrodes Rx1 to Rx3 having a double layer construction are formed. The third photo resist pattern exposes the first touch electrodes Rx1 to Rx3. And also, a fourth photo resist pattern (not shown) is formed on the inorganic layer 200 on which the second touch electrodes Tx1 to Tx3 having a double layer construction are formed. The fourth photo resist pattern exposes the second touch electrodes Tx1 to Tx3.

The metal layers of the first touch electrodes Rx1 to Rx3 exposed through the third photo resist pattern are removed by etching. The third photo resist pattern is removed to form the first touch electrodes Rx1 to Rx3 having a single transparent conductive layer in the touch electrode forming electrode A of the base layer 100.

The metal layers of the second touch electrodes Tx1 to Tx3 exposed through the fourth photo resist pattern are removed by etching. The fourth photo resist pattern is removed to form the second touch electrodes Tx1 to Tx3 having a single transparent conductive layer in the touch electrode forming electrode A of the inorganic layer 200.

The first and second routing wires RW1 to RW3 and TW1' to TW3' are formed in the routing wire forming area B of the base layer 100, and the third routing wires TW1 to TW3 are formed in the routing wire forming area B of the inorganic film 200. Each of the first to third routing wires RW1 to RW3, TW1' to TW3' and TW1 to TW3 has a double layer consisting of the transparent conductive layer and the metal layer. Also, the first and second routing pads RP1 to RP3 and TP1 to TP3 having a double layer consisting of the transparent conductive layer and the metal layer are formed in the pad forming area C.

The transparent conductive layer is formed of transparent conductive material such as indium tin oxide (ITO), indium zinc oxide (IZO), gallium-doped zinc oxide (GZO), metal mesh type transparent electrode, and metal nanowire or carbon-based transparent electrode, and the metal layer is formed of metal material such as Al, AlNd, Mo, MoTi, Cu, Cr, Ag, and Ag-based alloy.

In the above description, the first and second touch electrodes Rx1 to Rx3 and Tx1 to Tx3, the first to third routing wires RW1 to RW3, TW1' to TW3' and TW1 to TW3, and the first and second routing pads RP1 to RP3 and TP1 to TP3 are formed using two masks. However they may be formed through one photolithography process using e.g., a halftone mask. Provided that the process using the halftone mask is used, they may be formed with one mask process. The description about the process using the halftone mask is omitted because it is known as the related art.

Figure 9:
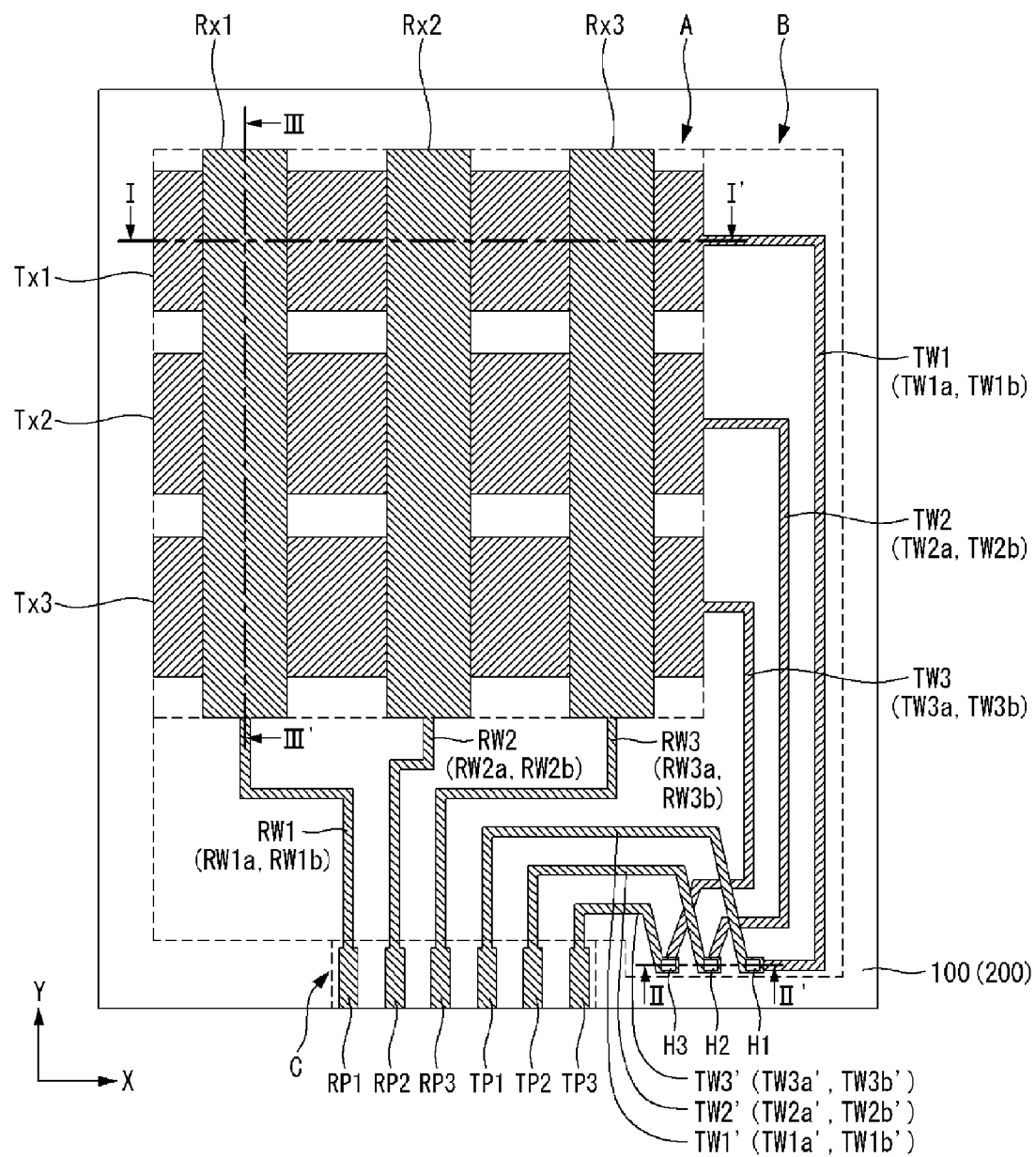
FIG. 9 is a top planer view illustrating a third process for manufacturing a touch sensor according to one embodiment of this disclosure.

Thirdly, a process of forming a plurality of holes is described with reference to FIGS. 9, 10A and 10B. FIG. 9 is a top planer view illustrating a third process for manufacturing a touch sensor according to one embodiment of this disclosure, FIG. 10A is a cross-sectional view taken along lines I-I' and II-II' of FIG. 9, and FIG. 10B is a cross-sectional view taken along line III-III' of FIG. 9.

Figure 10A:
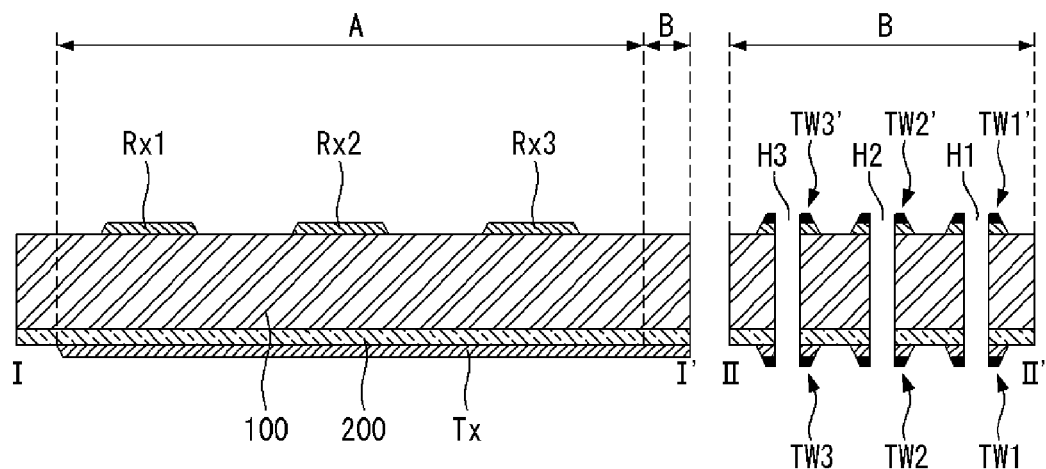
FIG. 10A is a cross-sectional view taken along lines I-I' and II-II' of FIG. 9.
Figure 10B:
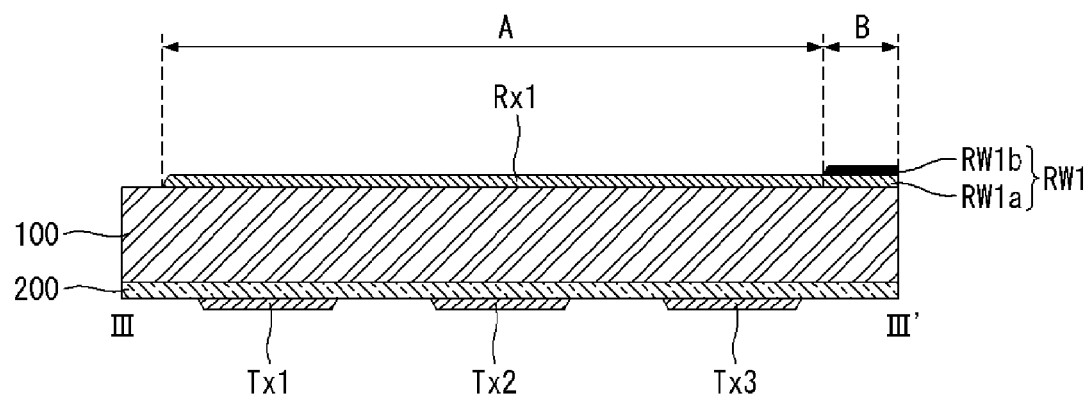
FIG. 10B is a cross-sectional view taken along line III-III' of FIG. 9.

Referring to FIGS. 9, 10A and 10B, a plurality of holes H1 to H3 passing through the second routing wires TW1' to TW3', the base layer 100, the inorganic layer 200, and the third routing wires TW1 to TW3, respectively are formed. Even though the holes H1 to H3 are formed by a photolithography process, but preferably formed by a laser drill method, a computerized numerical control (CNC) drill method, or a punching method.

In the above description, each of the plurality of holes H1 to H3 is formed of through hole type. But this disclosure does not limited thereto. For example, the holes may be formed of contact holes which pass through the second routing wires TW1' to TW3', the base layer 100 and the inorganic layer 200 to expose the third routing wires TW1 to TW3, or pass through the third routing wires TW1 to TW3, the inorganic layer 200 and the base layer 100 to expose the second routing wires TW1' to TW3'.

Figure 11:
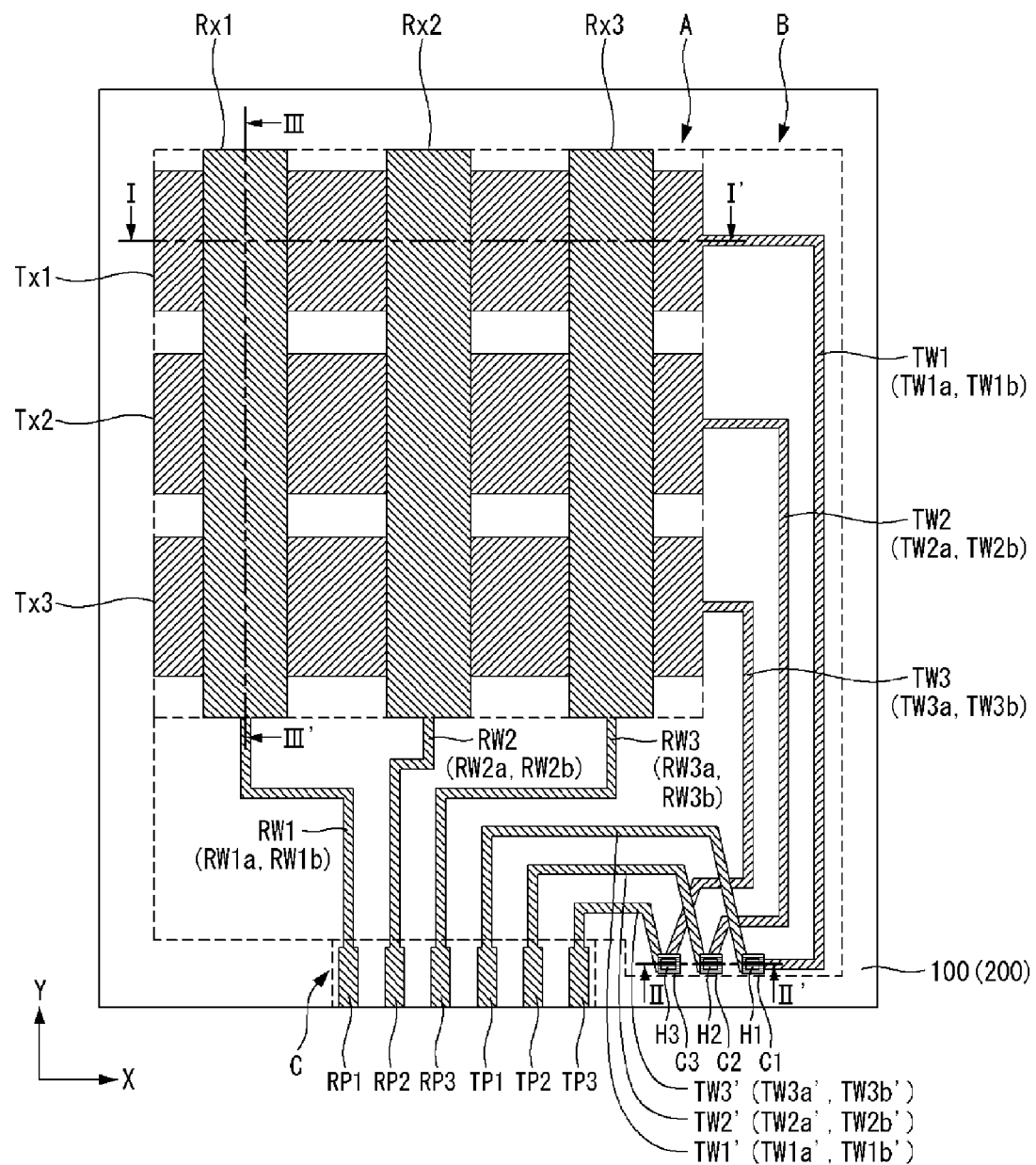
FIG. 11 is a top planer view illustrating a fourth process for manufacturing a touch sensor according to one embodiment of this disclosure.

Lastly, a process of forming a plurality of connectors is described with reference to FIGS. 11, 12A and 12B. FIG. 11 is a top planer view illustrating a fourth process for manufacturing a touch sensor according to one embodiment of this disclosure, FIG. 12A is a cross-sectional view taken along lines I-I' and II-II' of FIG. 11, and FIG. 12B is a cross-sectional view taken along line III-III' of FIG. 11.

Figure 12A:
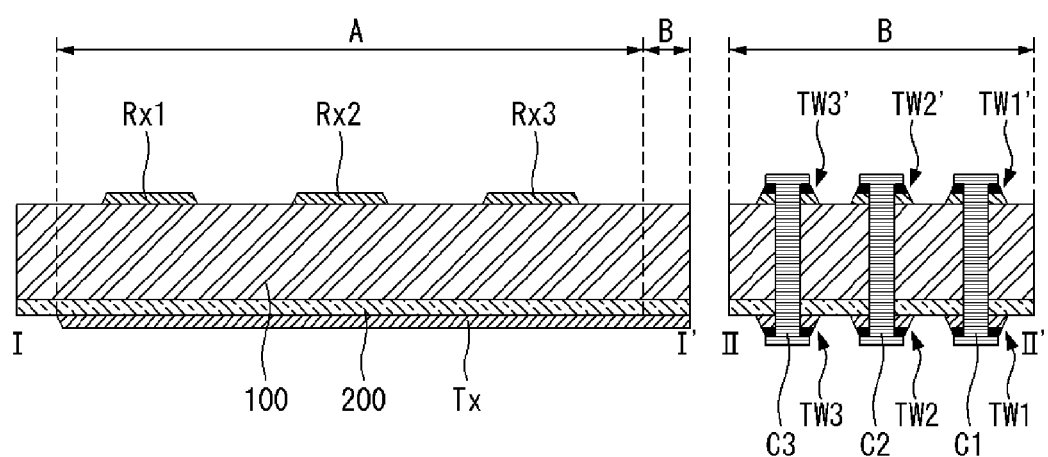
FIG. 12A is a cross-sectional view taken along lines I-I' and II-II' of FIG. 11.
Figure 12B:
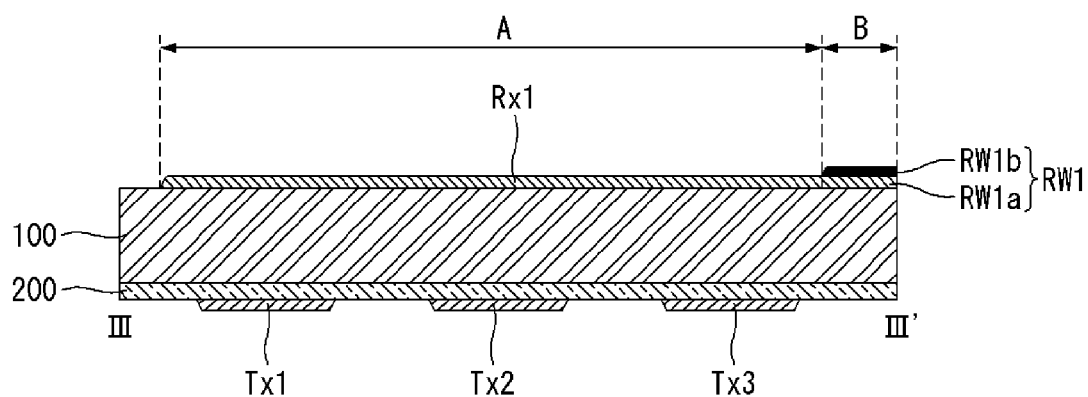
FIG. 12B is a cross-sectional view taken along line III-III' of FIG. 11.

Referring to FIGS. 11, 12A and 12B, a plurality of connectors C1 to C3 are formed by filling metal material within the holes H1 to H3 from both directions of the base layer 100 and the inorganic layer 200 through a screen printing method, a dispense method, an inkjet method or an electroplating method. The plurality of connectors C1 to C3 connect the second routing wires TW1' to TW3' formed on the base layer 100 to the third routing wires TW1 to TW3 formed on the inorganic layer 200 via the holes H1 to H3, respectively.

The metal material may include Al, AlNd, Mo, MoTi, Cu, Cr, Ag, and Ag-based alloy.

According to the OLED display panel having a touch sensor, it is possible to reduce thickness, weight and manufacturing cost thereof because the base layer of the touch sensor according to one embodiment of this disclosure may be served as at least one of a barrier film for preventing moisture or oxygen from permeating the organic light emitting diode OLED, an anti-scratch film, and a circular polarization film.

According to the OLED display panel having a touch sensor, it is possible to use one of a barrier layer, an anti-scratch layer, and a circular polarization layer included in the OLED display panel as a base layer of a touch sensor. Accordingly, it is possible to simply implement a construction for connecting to an external circuit because the first and second touch pads are formed on one side of the base layer by connecting the second routing wires and the third routing wires formed on both sides of the base layer through a plurality of holes. It is a very effective technical feature because the first and second touch pads should be formed on the both sides of the base layer if a rigid material such as glass is used as the base layer.

While the invention has been described with respect to a limited number of embodiments, those skilled in the art, having benefit of the above description, will appreciate that other embodiments can be devised which do not depart from the scope of the invention as disclosed herein. Accordingly, the scope of the invention should be limited only by the attached claims.

What is claimed is:

1. An organic light emitting diode (OLED) display device having a substrate on which organic light emitting diodes (OLEDs) and a passivation film for protecting the OLEDs are formed, and a touch sensor disposed on the substrate, the touch sensor comprising:
    a base layer having a first outer surface and a second outer surface that are opposite to each other;
    a plurality of first touch electrodes arranged directly on the first outer surface of the base layer;
    an inorganic layer directly on the second outer surface of the base layer;
    a plurality of second touch electrodes arranged directly on the inorganic layer in a direction perpendicular to the first touch electrodes;
    a plurality of first routing wires connected to the plurality of first touch electrodes on the first outer surface of the base layer, respectively;
    a plurality of second routing wires separated from the plurality of first routing wires and formed on the first outer surface of the base layer; and
    a plurality of third routing wires connected to the plurality of second routing wires respectively via holes that pass through the base layer, and formed on the second outer surface of the base layer,
    wherein the base layer is one of a barrier layer, an anti-scratch layer, and a circular polarization layer.

2. The OLED display device of claim 1, wherein the circular polarization layer disposed on the touch sensor, wherein the base layer is one of the barrier layer and the anti-scratch layer.

3. The OLED display device of claim 1, further comprising a linear polarization layer disposed on the touch sensor, wherein the base layer is the circular polarization layer.

4. The OLED display device of claim 1, wherein the inorganic layer disposed between the base layer and the third routing wires.

5. The OLED display device of claim 4, wherein each of the holes is a through hole passing through the second routing wire, the base layer, the inorganic layer, and the third routing wire.

6. The OLED display device of claim 4, wherein each of the holes is a contact hole passing through the base layer, the inorganic layer, and the third routing wires to expose the third routing wire.

7. The OLED display device of claim 4, wherein each of the holes is a contact hole passing through the third routing wire, the inorganic layer, and the base layer to expose the second routing wire.

8. The OLED display device of claim 5, further comprising a plurality of connectors filled within the holes to connect the second routing wires to the third routing wires, respectively.

9. The display device of claim 1, wherein each of the first and second touch electrodes is formed of a transparent conductive layer.

10. The display device of claim 1, wherein each of the first, second and third routing wires is formed of a transparent conductive layer and metal layer.

11. The display device of claim 1, wherein the base layer is formed from optical isotropy material having non-elongation property.

12. The display device of claim 1, wherein at least one of the first, second and third routing wires has a double-layer structure including a first layer formed of a transparent conductive material and a second layer formed of a metal material.

13. The display device of claim 1, wherein the first touch electrodes and the second touch electrodes are separated from each other by the base layer and the inorganic layer.

* * * * *